(12) United States Patent
Shimura et al.

(10) Patent No.: US 8,000,824 B2
(45) Date of Patent: Aug. 16, 2011

(54) AUDIO REPRODUCING APPARATUS

(75) Inventors: Masaru Shimura, Kanagawa (JP); Taro Nakagami, Kanagawa (JP); Kazunobu Ohkuri, Kanagawa (JP)

(73) Assignee: Sony Corporation, Tokyo (JP)

( * ) Notice: Subject to any disclaimer, the term of this patent is extended or adjusted under 35 U.S.C. 154(b) by 973 days.

(21) Appl. No.: 11/974,702

(22) Filed: Oct. 16, 2007

(65) Prior Publication Data

US 2008/0130915 A1 Jun. 5, 2008

(30) Foreign Application Priority Data

Oct. 18, 2006 (JP) ................... 2006-283533

(51) Int. Cl.
*G06F 17/00* (2006.01)
(52) U.S. Cl. ........................................ 700/94
(58) Field of Classification Search ............. 700/94; 381/61, 98, 101
See application file for complete search history.

(56) References Cited

U.S. PATENT DOCUMENTS

| | | | | |
|---|---|---|---|---|
| 5,930,373 A | * | 7/1999 | Shashoua et al. | 381/98 |
| 7,394,908 B2 | * | 7/2008 | Katou et al. | 381/98 |
| 7,412,220 B2 | * | 8/2008 | Beyer | 455/222 |
| 2001/0036278 A1 | * | 11/2001 | Polisset et al. | 381/61 |
| 2004/0071297 A1 | * | 4/2004 | Katou et al. | 381/61 |
| 2004/0234083 A1 | * | 11/2004 | Katou et al. | 381/101 |

FOREIGN PATENT DOCUMENTS

| | | |
|---|---|---|
| JP | 08-213862 | 8/1996 |
| WO | WO 97/42789 A1 | 11/1997 |
| WO | WO 00/14998 A1 | 3/2000 |
| WO | WO 01/78447 A1 | 10/2001 |

\* cited by examiner

*Primary Examiner* — Andrew C Flanders
(74) *Attorney, Agent, or Firm* — Wolf, Greenfield & Sacks, P.C.

(57) ABSTRACT

An audio signal processing apparatus includes a high-pass filter for extracting from an audio signal a frequency component higher than f0, n band-pass filters for extracting, from the audio signal, frequency components falling within a frequency range from f0/N to f1/N, n harmonic overtone generators for frequency multiplying each of outputs of the n band-pass filters by N, a first combining unit for combining the generated harmonic overtone components, a level detector for detecting a level of a supplied harmonic overtone component, a gain controller for controlling dynamically the harmonic overtone component supplied from the first combining unit, and a second combining unit for combining the frequency component extracted by the high-pass filter and a harmonic overtone component output from the gain controller, where N is (n being a natural number), f0 is a first predetermined frequency, and f1 is a second predetermined frequency higher than f0.

20 Claims, 12 Drawing Sheets

FIG. 11
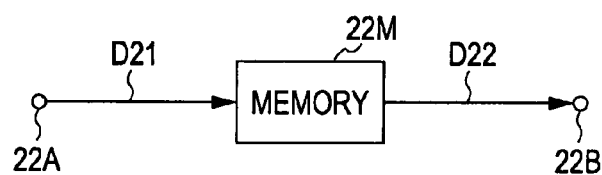
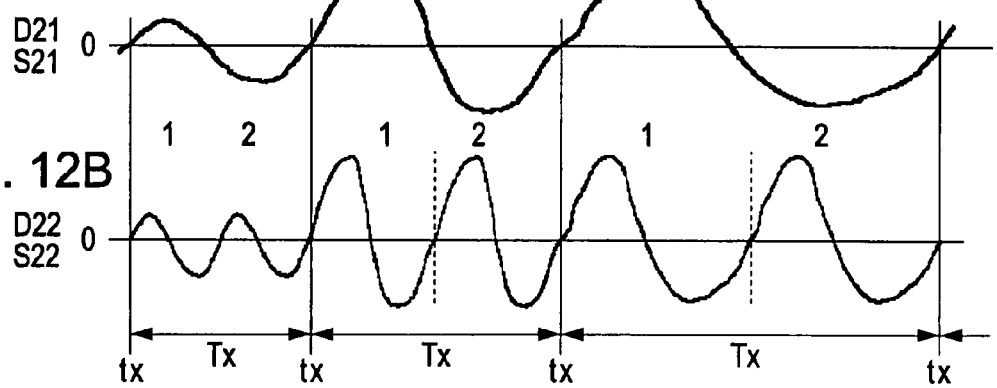

AUDIO REPRODUCING APPARATUS

CROSS REFERENCES TO RELATED APPLICATIONS

The present invention contains subject matter related to Japanese Patent Application JP 2006-283533 filed in the Japanese Patent Office on Oct. 18, 2006, the entire contents of which are incorporated herein by reference.

BACKGROUND OF THE INVENTION

1. Field of the Invention

The present invention relates to an audio reproducing apparatus.

2. Description of the Related Art

Small loudspeakers are employed in minicomponent stereo sets and flat-screen television receivers. In such applications, the enclosure of the loudspeaker (speaker box) is accordingly small. The resonance frequency f0 of the loudspeaker is as high as or higher than 100 Hz.

An audio signal having the resonance frequency f0 or lower may be supplied to the loudspeaker. With the frequency being lowered, the fundamental component is increasingly lowered while distorted components (harmonic components) sharply increases in the sound output pressure thereof.

Audio apparatuses having small loudspeakers cannot sufficiently reproduce low-frequency component lower than the resonance frequency f0 of the loudspeaker.

The sound of each musical instrument is composed of a fundamental component and harmonic components, and the ratio of the fundamental component to the harmonic components determines the tone of the sound. It has been psychoacoustically proved that if a sound without the fundamental component but with the harmonic components thereof is output humans hear as if the fundamental component is also output.

An audio apparatus taking advantage of such human hearing characteristics is contemplated. FIG. 13 illustrates such an audio apparatus. A loudspeaker 5 is used to improve a low frequency sound effect.

An audio signal S1 is supplied to a high-pass filter 2 at an input terminal 1. As shown in FIG. 14A, a middle to high-frequency component equal to or higher than the resonance frequency f0 of the loudspeaker 5 is extracted and supplied to an adder 3. The audio signal S1 at the terminal 1 is supplied to a band-pass filter 7. As shown in FIG. 14B, a low-frequency component S7 falling within a frequency band from f0/2 to f0 is extracted and supplied to a pitch shifter 8.

The pitch shifter 8 doubles the frequency of the supplied low-frequency component S7. As shown in FIG. 14C, a frequency multiplied component S8 within a band from f0 to 2f0, namely, the harmonic overtone component S8, is output.

The harmonic overtone component S8 is supplied to the adder 3 to be added to the middle to high-frequency component S2. The adder 3 outputs an audio signal S3 with the harmonic overtone component S8 as the low-frequency component S7 reinforced as shown in FIG. 14D. The audio signal S3 is output to the loudspeaker 5 via a power amplifier 4. The loudspeaker 5 thus emits an acoustic sound having frequency characteristics of FIG. 14D, namely, an acoustic sound with the harmonic overtone component S8 as the reinforced low-frequency component S7.

The sound of the low-frequency component S7 is not output from the loudspeaker 5 and corresponds to the fundamental component. The corresponding harmonic overtone component S8 is output from the loudspeaker 5. A listener hears as if the low-frequency component S7 is actually output. Even with the small loudspeaker 5, the low frequency sound effect is thus provided.

It is generally said that humans suffer from no unpleasant hearing impression on the harmonic overtone component S8 lower than 200 Hz even if the frequency multiplied component S5 is generated by multiplying the low-frequency component S7.

Japanese Unexamined Patent Application Publication No. 8-213862 discloses one such technique.

SUMMARY OF THE INVENTION

The harmonic overtone component S8 is similar to a harmonic overtone of the low-frequency component S7 in the above described audio reproducing apparatus. If the harmonic overtone component S8 is increased in amount to provide the low frequency sound effect, the degree of distortion is also increased. If the harmonic overtone component S8 is reduced in amount to lower the degree of distortion, the low frequency sound effect becomes insufficient. There is a trade-off between the low frequency sound effect and the degree of distortion.

It is thus desirable to overcome such a problem.

In accordance with one embodiment of the present invention, an audio signal processing apparatus includes a high-pass filter for extracting from an audio signal a frequency component equal to or higher than a frequency f0, n band-pass filters for extracting, from the audio signal, frequency components falling within a frequency range from the frequency f0/N to a frequency f1/N, n harmonic overtone generators for frequency multiplying each of outputs of the n band-pass filters by N to generate harmonic overtone components having multiplied-by-N frequencies, a first combining unit for combining the harmonic overtone components generated by the n harmonic overtone generators, a level detector for detecting a level of a harmonic overtone component supplied from the first combining unit, a gain controller for controlling dynamically the harmonic overtone component supplied from the first combining unit based on a detection output from the level detector, and a second combining unit for combining the frequency component extracted by the high-pass filter and a harmonic overtone component output from the gain controller, where N is 2n (n being a natural number), the frequency f0 is a first predetermined frequency, and the frequency f1 is a second predetermined frequency higher than the frequency f0.

In accordance with the embodiment of the present invention, if a low-frequency component of the audio signal is lower in frequency than the resonance frequency f0, the sound of the harmonic overtone component obtained from the low-frequency component is emitted from a loudspeaker. When the harmonic overtone component is output, the level thereof is dynamically changed. A crisp low-frequency sound effect is thus provided while the degree of distortion in the sound is reduced.

BRIEF DESCRIPTION OF THE DRAWINGS

FIG. 11 illustrates a memory in the audio signal processing apparatus;

FIGS. 12A and 12B are waveform diagrams illustrating the memory of FIG. 11;

DESCRIPTION OF THE PREFERRED EMBODIMENTS

Figure 1:
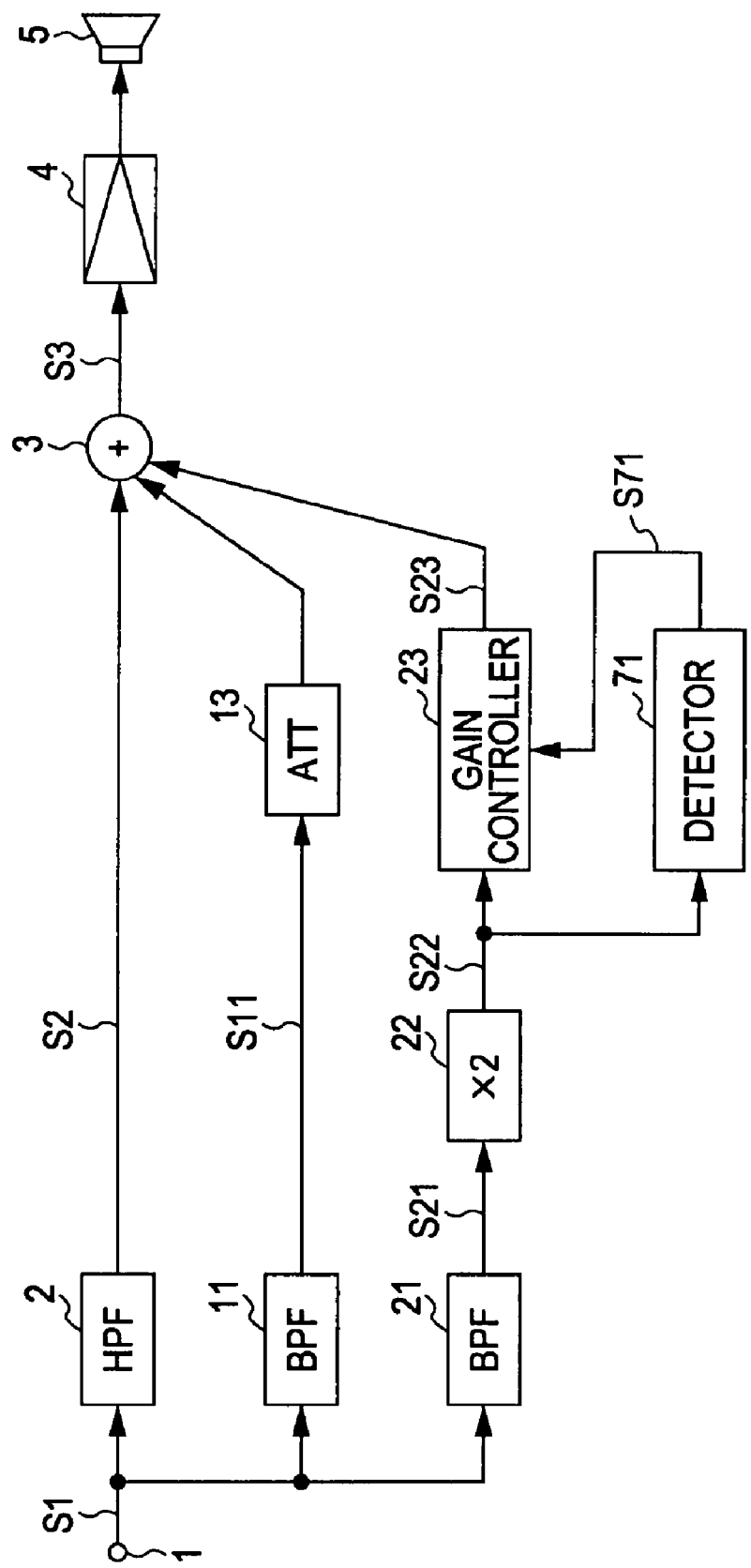
FIG. 1 is a block diagram of an audio signal processing apparatus in accordance with one embodiment of the present invention.

FIG. 1 illustrates an audio signal processing apparatus in accordance with one embodiment of the present invention. A small loudspeaker 5 provides an improved low frequency sound effect. Let f0 represent a resonance frequency of the loudspeaker 5. The resonance frequency f0 is 100 Hz or lower. Let f1 represent a frequency upper limit below which a signal obtained by frequency multiplying a fundamental frequency signal causes no unpleasant hearing impression. The frequency upper limit f1 is a frequency obtained by frequency multiplying a fundamental frequency of a signal. The frequency upper limit f1 is about 200 Hz. Here, f0=f1/2 (or f0≦f1/2). In the case of a two-channel stereophonic system or multi-channel stereophonic system, each channel has the structure of FIG. 1.

An audio signal S1 is supplied to a high-pass filter 2 via an input terminal 1. As represented by a solid line in FIG. 2A, a middle to high frequency component S2 equal to or higher than the resonance frequency f0 of the loudspeaker 5 is extracted. The middle to high frequency component S2 is then supplied to an adder 3. A band-pass filter 11 having a pass-band frequency of f0 to f1, namely, 100 Hz to 200 Hz, is arranged. The audio signal S1 is supplied from the input terminal 1 to the band-pass filter 11. As represented by a broken line in FIG. 2A, a low-frequency component S11 in a frequency range f0-f1 is thus extracted. The low-frequency component S11 is supplied to the adder 3 via an attenuator 13.

A band-pass filter 21 having a frequency pass-band f0/2-f1/2, namely, 50 Hz to 100 Hz is arranged. The audio signal S1 is supplied from the input terminal 1 to the band-pass filter 21. As shown in FIG. 2B, a low-frequency component S21 in a frequency range f0/2-f1/2 is extracted. The low-frequency component S21 is supplied to a pitch shifter 22.

An example of the pitch shifter 22 will be described later. The pitch shifter 22 frequency doubles the supplied low-frequency component S21. As shown in FIG. 2C, the pitch shifter 22 outputs a frequency-doubled, harmonic overtone component S22 in a frequency range f0-f1. The frequency-doubled, harmonic overtone component S22 is supplied to a gain controller 23 to be discussed later. The gain controller 23 level controls the harmonic overtone component S22, thereby outputting a harmonic overtone component S23. The harmonic overtone component S23 is supplied to the loudspeaker 5.

Figure 2A:
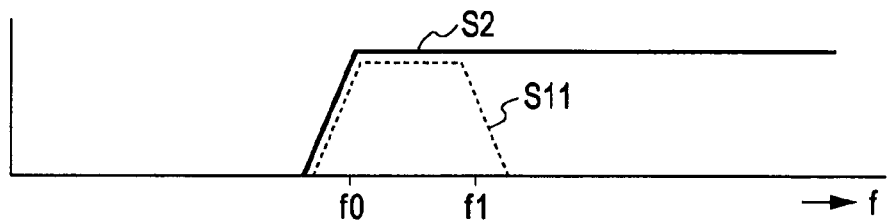
FIGS. 2A-2D illustrate frequency characteristics of the audio signal processing apparatus.
Figure 2B:
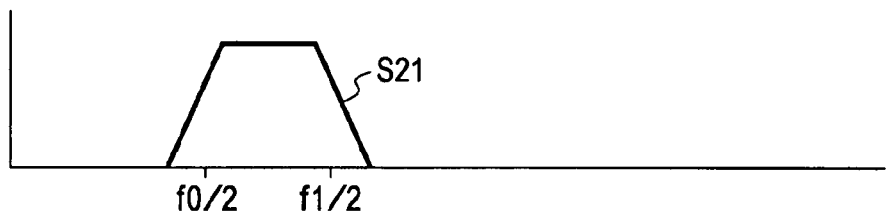
Figure 2C:
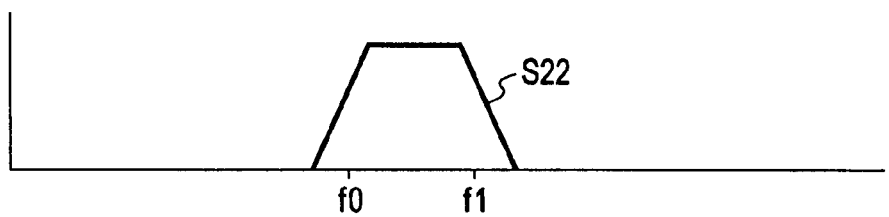
Figure 2D:
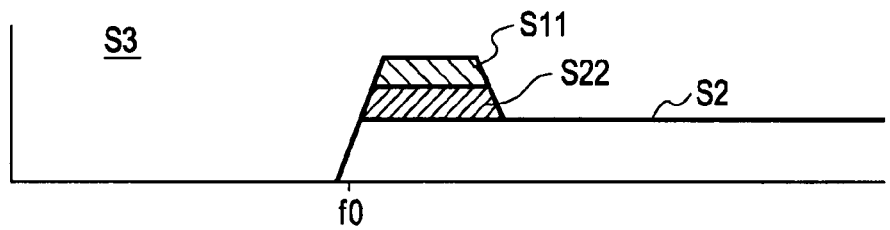

As shown in FIG. 2D, the adder 3 outputs an audio signal S3. The audio signal S3 is obtained by adding the low-frequency component S11 and the frequency-doubled, harmonic overtone component S22 at predetermined ratios to the middle to high frequency component S2. The audio signal S3 is then supplied to the loudspeaker 5.

Figure 3:
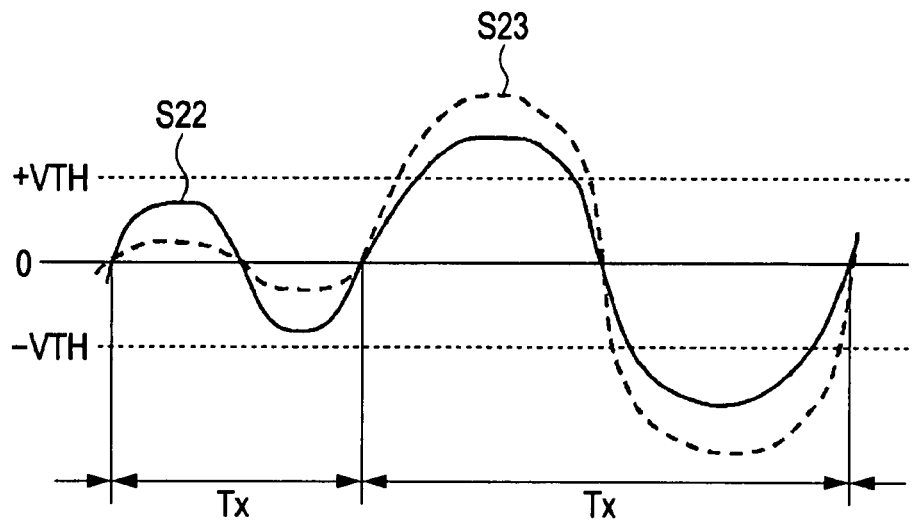
FIG. 3 is a waveform diagram of the audio signal processing apparatus.

One embodiment of the present invention further includes the following elements. The gain controller 23 is arranged as described above. The harmonic overtone component S22 output from the pitch shifter 22 is supplied to a level detector 71. As shown in FIG. 3, one cycle of the low-frequency component S22, i.e., a duration Tx from a reversal from negative to positive to a next reversal from negative to positive is determined as one period. A peak level V22 (absolute value), detected within one period Tx, is referred to as a detected signal S71. The detected signal S71 is supplied to the gain controller 23 as a gain control signal.

Figure 4:
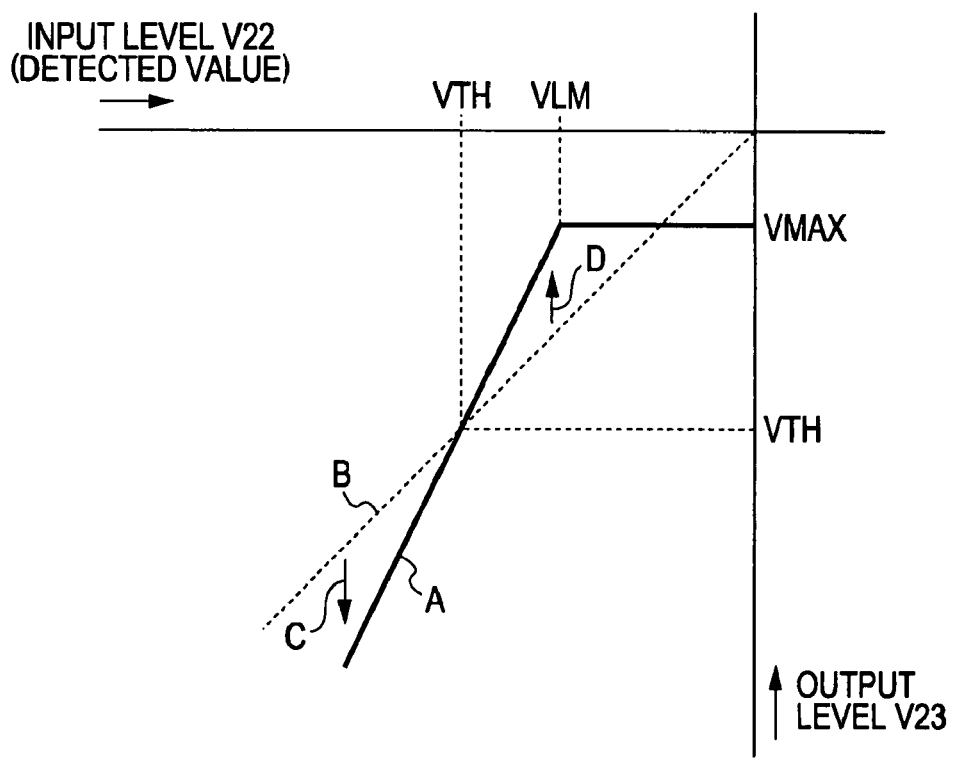
FIG. 4 illustrates control characteristics of the audio signal processing apparatus.

FIG. 4 illustrates control characteristics of the gain controller 23. The abscissa represents the input level of the low-frequency component S22 supplied to the gain controller 23, namely, the peak level V22 of the band-pass filter 22 within one period Tx from which the signal S71 is detected. The ordinate represents an output level V23 of a low-frequency component S23 output from the gain controller 23. A broken line B represents characteristics with gain being 1 regardless of the input level V22 (peak level) for reference only in FIG. 4.

Control characteristics of the gain controller 23 is represented by line A. Let VLM represent a predetermined upper limit and VTH represent a predetermined threshold level (VLM>VTH). V23=VMAX holds if V22≧VLM. V23 is in linear proportion to level V22 with relationship V22<VLM held. Gain is greater than 1 if relationship VTH<V22<VLM holds. Gain is 1 if relationship V22=VTH holds. Gain is smaller than 1 if relationship V22<VTH holds.

The gain controller 23 level controls the low-frequency component S22 on a per period Tx in accordance with the detected signal S71 and the control characteristics A. The harmonic overtone component S23 thus results. The peak level V22 cannot be known until one period Tx is completed. For simplicity, it is assumed the peak level V22 within the one period Tx can be detected at the start of the period Tx. To perform the above-described detection and control, the low-frequency component S22 to be level controlled is pre-delayed to be synchronized with the corresponding detected signal S71.

With the above-described arrangement, the pitch shifter 22 generates the harmonic overtone component S22 twice in frequency the low-frequency component S21 in response to the audio signal S1 at the input terminal 1. The gain controller 23 level controls the harmonic overtone component S22, thereby outputting the harmonic overtone component S23. The adder 3 adds the harmonic overtone component S23 and the low-frequency component S11 to the high-pass filter 2. As shown in FIG. 2D, the adder 3 outputs the audio signal S3 having frequency characteristics of FIG. 2D. The audio signal S3 is then supplied to the loudspeaker 5. The loudspeaker 5 outputs the sound responsive to the audio signal S3.

Although almost no sound of the fundamental component lower than the resonance frequency f0 is output from the loudspeaker 5, the harmonic overtone component S22 twice as high as the low-frequency component S21 (FIG. 2B) is output. A listener may hear the sound as if the sound lower than the resonance frequency f0 is output. Even with the small loudspeaker 5, the low frequency sound effect is provided.

Since the gain controller 23 has control characteristics of FIG. 4, the output harmonic overtone component S23 has a waveform as represented by a broken line in FIG. 3. If the peak level V22 of the low-frequency component S22 within the one period Tx is lower than the threshold level VTH, the output level V23 of the low-frequency component S23 becomes smaller than the original magnitude as represented by an arrow C in FIG. 4. If the peak level V22 of the low-frequency component S22 within the one period Tx is higher than the threshold level VTH, the output level V23 of the low-frequency component S23 becomes larger than the original magnitude as represented by an arrow D in FIG. 4.

As represented by the broken line in FIG. 3, the output level V23 of the low-frequency component S23 output from the gain controller 23 becomes more smaller throughout one period Tx during which the peak level V22 is smaller than the threshold level VTH, and becomes more larger throughout one period Tx during which the peak level V22 is larger than the threshold level VTH. Since the harmonic overtone component S23 dynamically changes in level in the same way, a crisp low frequency sound effect is provided while distortion effect is restricted.

Since part of the low-frequency component S11 contained in the audio signal S1 still reinforced as shown in FIGS. 2A and 2D, the low frequency sound effect becomes natural.

Figure 5:
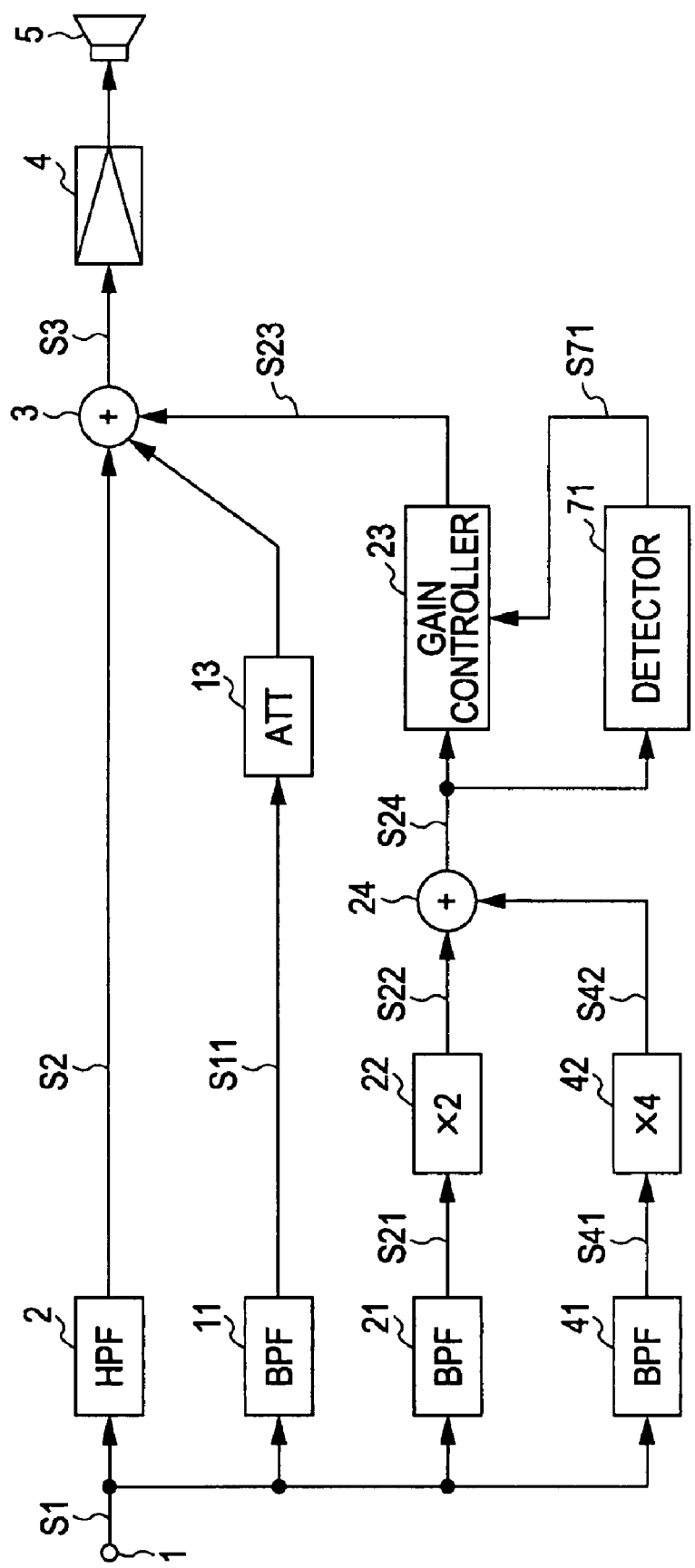
FIG. 5 illustrates another example of the audio signal processing apparatus.
Figure 6A:
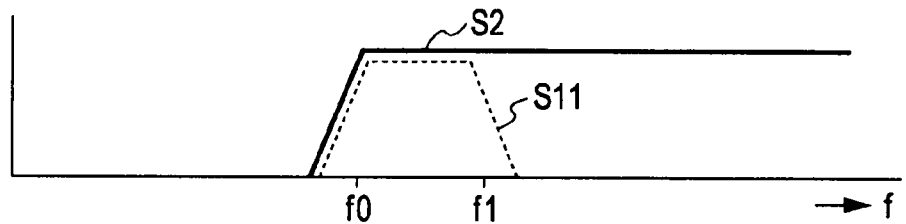
FIGS. 6A-6D illustrate frequency characteristics of the audio signal processing apparatus of FIG. 5.

FIG. 5 illustrates an audio signal processing apparatus in accordance with a second embodiment of the present invention. The audio signal processing apparatus of the second embodiment is intended to provide more low-frequency sound effect. As shown in FIG. 6A (as in FIG. 2A), the audio signal processing apparatus of FIG. 5 extracts the middle to high frequency component S2 and the low-frequency component S11 from the audio signal S1 and supplies the extracted component to the adder 3 in the same manner as in the audio signal processing apparatus of FIG. 1.

The audio signal S1 is supplied to the band-pass filter 21. As represented by a broken line in FIG. 6B, the low-frequency component S21 in a frequency range f0/2-f1/2 is extracted. The low-frequency component S21 is supplied to the pitch shifter 22. As represented by a solid line in FIG. 6B, the frequency-doubled, harmonic overtone component S22 falling within the frequency range f0-f1 is extracted.

Figure 6B:
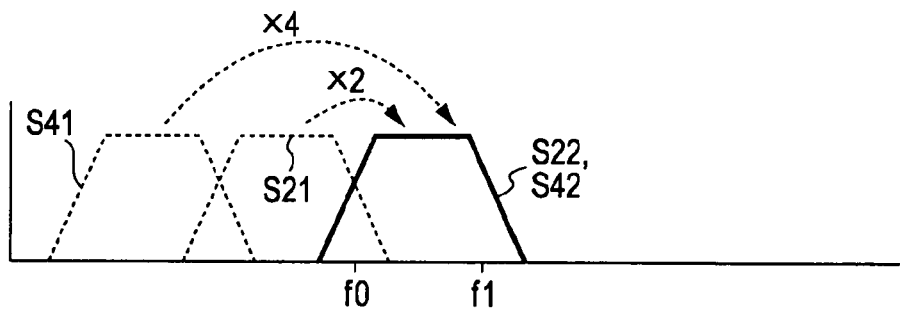

The audio signal S1 is supplied to a band-pass filter 41. As shown in FIG. 6B, a low-frequency component S41 falling within a frequency range f0/4-f1/4 is extracted. The low-frequency component S41 is supplied to a pitch shifter 42. As represented by the solid line in FIG. 6B, the pitch shifter 42 outputs a frequency-quadrupled, harmonic overtone component S42 falling within the frequency range f0-f1.

Figure 6C:
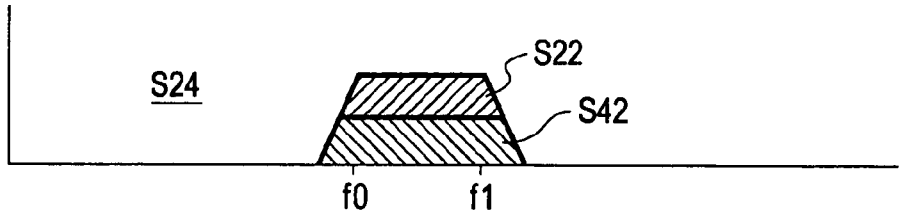
Figure 6D:
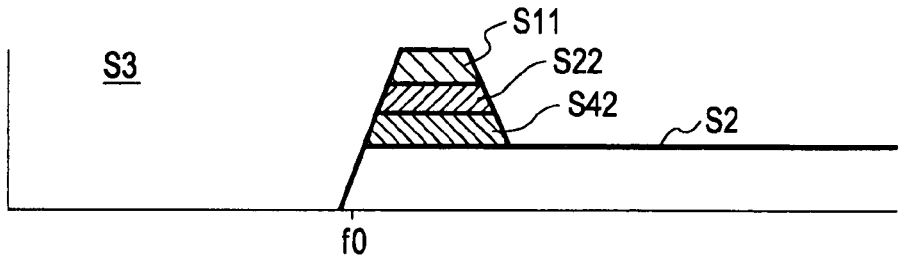

An adder 24 receives the harmonic overtone component S22 from the pitch shifter 22 and the harmonic overtone component S42 from the pitch shifter 42. as shown in FIG. 6C, the adder 24 outputs a harmonic overtone component S24 containing the harmonic overtone components S22 and S42. The harmonic overtone component S24 is supplied to the adder 3 via the gain controller 23. As shown in FIG. 6D, the adder 3 outputs the audio signal S3. The audio signal S3 is obtained by adding to the middle to high frequency component S2 the low-frequency component S11, the frequency-doubled, harmonic overtone component S22 and the frequency-quadrupled, harmonic overtone component S42 at predetermined ratios. The audio signal S3 is supplied to the loudspeaker 5 via the power amplifier 4.

The harmonic overtone component S24 output from the adder 24 is supplied to not only the gain controller 23 but also the level detector 71. Every one period Tx of the harmonic overtone component S24, the peak level V22 is detected. A detected signal S71 is supplied to the gain controller 23 as a gain control signal in that period Tx.

The audio signal S3 having frequency characteristics of FIG. 6D is supplied to the loudspeaker 5. The loudspeaker 5 outputs almost no sound corresponding to the fundamental component below the resonance frequency f0, but outputs the sound corresponding to the frequency-doubled, harmonic overtone component S22 and the frequency-quadrupled, harmonic overtone component S42. The listener hears the sound as if the sound below the resonance frequency f0 is also output. Even the small loudspeaker 5 thus provides low-frequency sound effect.

As represented by the broken line in FIG. 3, the output level V23 of the low-frequency component S23 output from the gain controller 23 becomes more smaller throughout one period Tx during which the peak level V22 is smaller than the threshold level VTH, and becomes more larger throughout one period Tx during which the peak level V22 is larger than the threshold level VTH. Since the harmonic overtone component S23 dynamically changes in level in the same way, a crisp low frequency sound effect is provided while distortion effect is restricted.

Since the level of the harmonic overtone component S23 dynamically changes, a crisp low-frequency sound effect is provided while distortion effect is controlled.

Figure 7A:
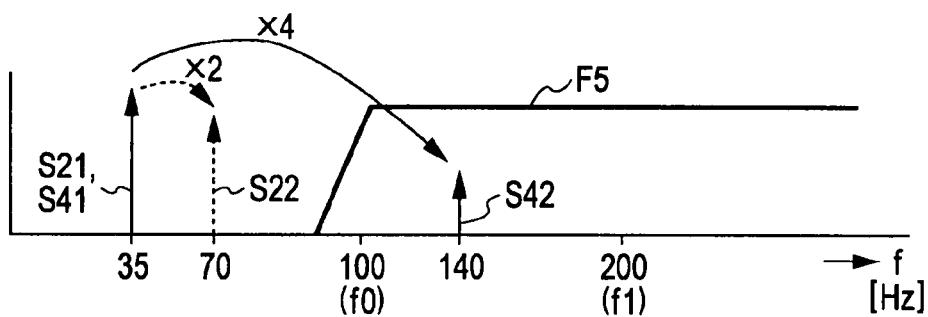
FIGS. 7A and 7B illustrate frequency characteristics of the audio signal processing apparatus of FIG. 5.

If the low-frequency component S21 (S41) is 35 Hz as shown in FIG. 7A, the harmonic overtone component S22 (represented by an arrow-headed broken line) obtained by doubling the frequency of the low-frequency component S21 has a frequency of 70 Hz, and the loudspeaker 5 is still unable to reproduce the harmonic overtone component S22.

In the audio signal processing apparatus of FIG. 5, the low-frequency component S21 (S41) having a frequency of 35 Hz, namely, the low-frequency component S41 is supplied to the pitch shifter 42 via the band-pass filter 41. The pitch shifter 47 frequency quadruples the low-frequency component S41 to the frequency-quadrupled, harmonic overtone component S42 (solid line) having a frequency of 140 Hz. The harmonic overtone component S42 is supplied to the adder 24. With the low-frequency component S21 (S41) having a frequency of 35 Hz, the frequency quadrupled, harmonic overtone component S42 results in a low frequency sound corresponding to the harmonic overtone component S21.

Figure 7B:
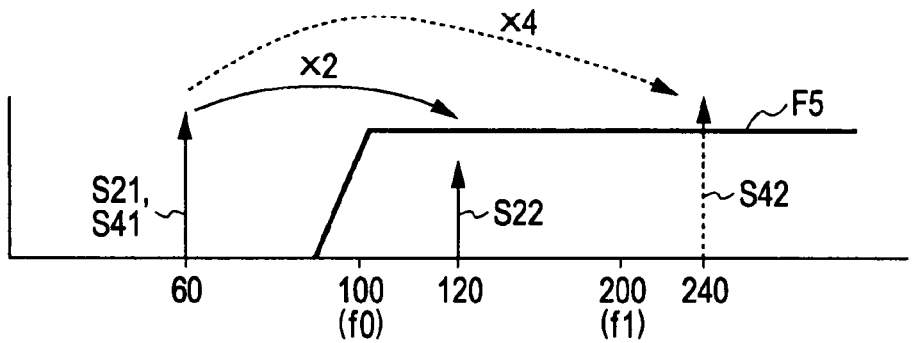

As shown in FIG. 7B, the low-frequency component S41 (S21) might have a frequency of 60 Hz. If the low-frequency component S41 is quadrupled in frequency to the harmonic overtone component S42 (as represented by a broken line), the resulting frequency is 240 Hz. The resulting frequency of 240 Hz is above the frequency upper limit f1 ($\approx$200 Hz) in the addition of the harmonic overtone. If the resulting harmonic overtone component S42 is supplied to the loudspeaker 5, an output sound results in an unpleasant hearing impression in human ears.

The low-frequency component S41 might have a frequency of 60 Hz in the apparatus of FIG. 5. The low-frequency component S41, namely, the low-frequency component S21 is supplied to the pitch shifter 22 via the band-pass filter 21. The pitch shifter 22 frequency doubles the low-frequency component S21 to the frequency-doubled, harmonic overtone component S22 (represented by a solid line) having a frequency of 120 Hz. The resulting harmonic overtone component S22 is supplied to the adder 24. Even when the low-frequency component S41 (S21) has a frequency of 60 Hz, the frequency-doubled, harmonic overtone component S22 results in a low frequency sound corresponding to the low-frequency component S41.

Figure 8:
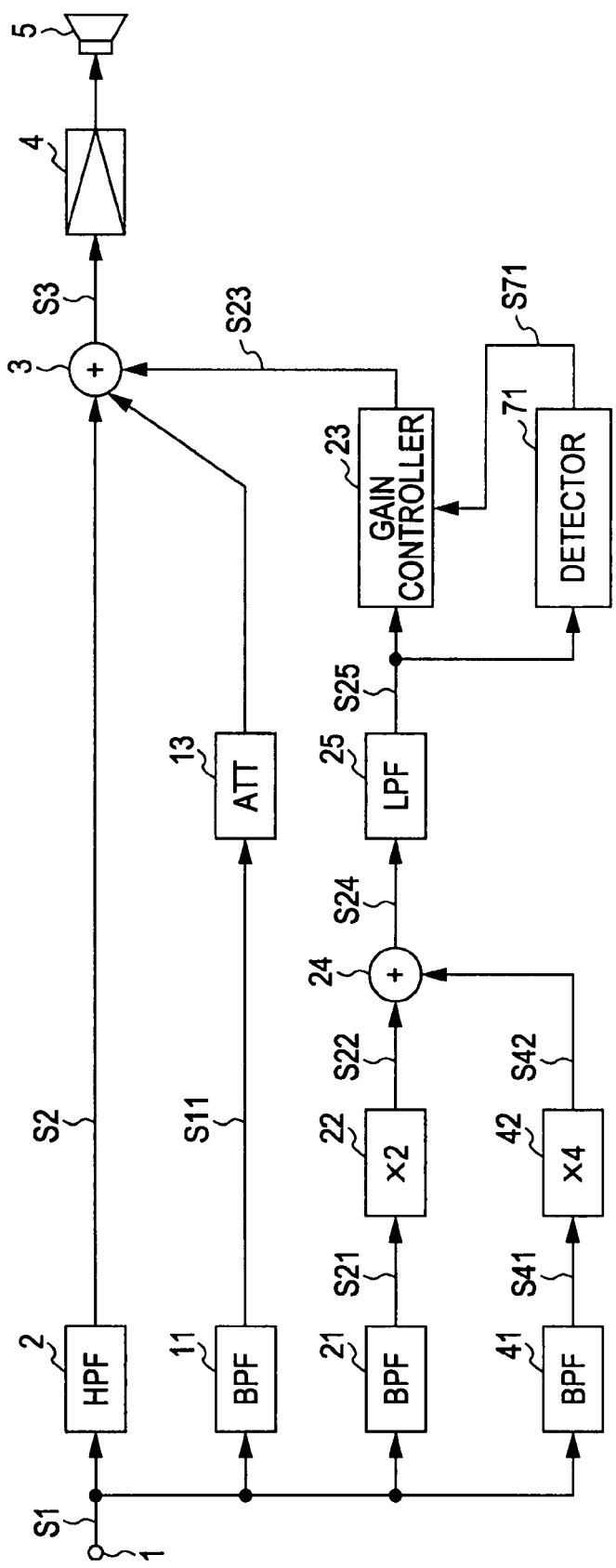
FIG. 8 illustrates yet another example of the audio signal processing apparatus.

FIG. 8 illustrates an audio signal processing apparatus of a third embodiment of the present invention. The audio signal processing apparatus effectively provides the low-frequency sound effect even with relationship f0>f1/2 held. As the audio signal processing apparatus of FIG. 5, the audio signal processing apparatus of FIG. 8 extracts the middle to high frequency component S2 and the low-frequency component S11 from the audio signal S1 and supplies the extracted components to the adder 3.

Figure 9A:
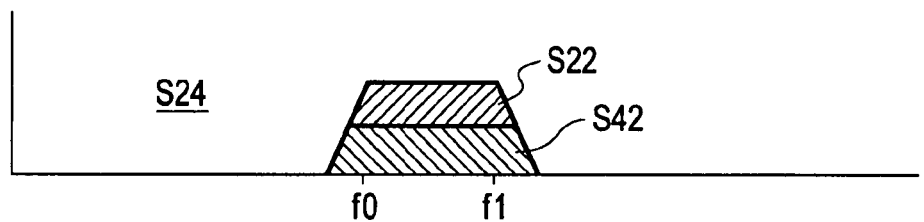
FIG. 9 illustrates frequency characteristics of the audio signal processing apparatus of FIG. 8.
Figure 9B:
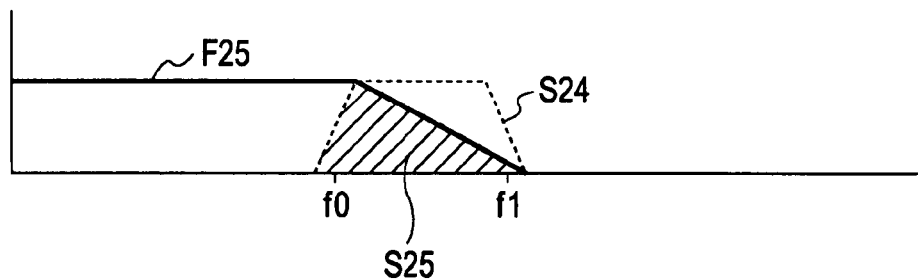

As the apparatus of FIG. 5, the band-pass filters 21 and 41, the pitch shifters 22 and 42 and the adder 24 generate the harmonic overtone component S24 as a result of adding the frequency doubled harmonic overtone component S22 and the frequency-quadrupled, harmonic overtone component S42 as shown in FIG. 9A (identical to FIG. 6C). The harmonic overtone component S24 is supplied to the low-pass filter 25. The low-pass filter 25 has frequency characteristics F25 of FIG. 9B having a cutoff frequency in the vicinity of the resonance frequency f0 and almost cuts off the input signal at the frequency upper limit f1.

The low-pass filter 25 outputs, out of the harmonic overtone component S24, the frequency-doubled and frequency-quadrupled harmonic overtone component S25 (hatched portion) that gives no unpleasant hearing impression. The harmonic overtone component S25 is supplied to not only the adder 3 via the gain controller 23 but also the level detector 71. Every one period Tx of the harmonic overtone component S25, the peak level V22 is detected. A detected signal S71 is supplied to the gain controller 23 as a gain control signal in that period Tx.

As in the audio signal processing apparatus of FIG. 5, the pitch shifters 22 and 42 generate the frequency-doubled, harmonic overtone component S22 and the frequency-quadrupled, harmonic overtone component S42 from the low-frequency component S21 and the low-frequency component S41, respectively. The harmonic overtone component S22 and the harmonic overtone component S42 are added to as the middle to high frequency component S2. As described above, the listener hears the sound as if the sound below the resonance frequency f0 of the loudspeaker 5 is output. Even with the small loudspeaker 5, the low-frequency sound effect is provided.

The adder 3 adds the frequency-doubled and frequency-quadrupled harmonic overtone component S23 to the middle to high frequency component S2. The low-pass filter 25 lowers more the level of the harmonic overtone component S23 as frequency becomes closer to the frequency upper limit f1. Even if the harmonic overtone component S24 contains a frequency component even above the frequency upper limit f1, the harmonic overtone component S23 does not contain such a frequency component. A low frequency sound effect is thus provided even within the frequency range f0>f1/2 without any unpleasant hearing impression.

Figure 10A:
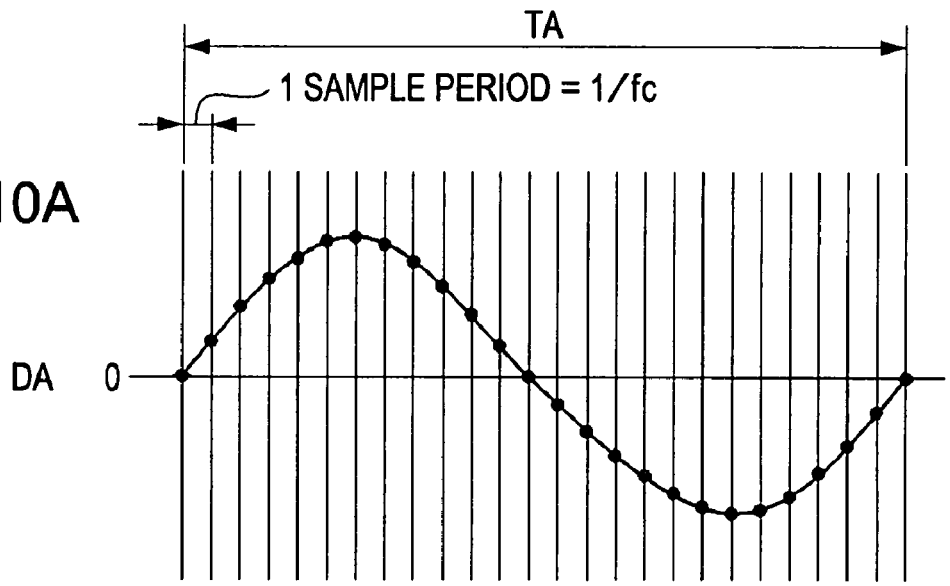
FIGS. 10A-10C are waveform diagrams of the audio signal processing apparatus.

The harmonic overtone component S22 twice in frequency the low-frequency component S21 and the pitch shifter 42 four times in frequency the low-frequency component S41 are produced as shown in FIGS. 10A-1-C. As shown in FIG. 11A, digital data DA for digital-to-analog converting one period of a sinusoidal signal SA is now stored on a memory. Each solid dot symbol "•", represents a sampling point, and one sample is stored at one corresponding address. A duration TA represents one sample cycle of the sinusoidal signal SA, and a duration 1/fc is one sample period.

If the digital data DA is read at a clock frequency fc identical to a write clock, one cycle of the sinusoidal signal SA can be read for the duration TA.

Figure 10B:
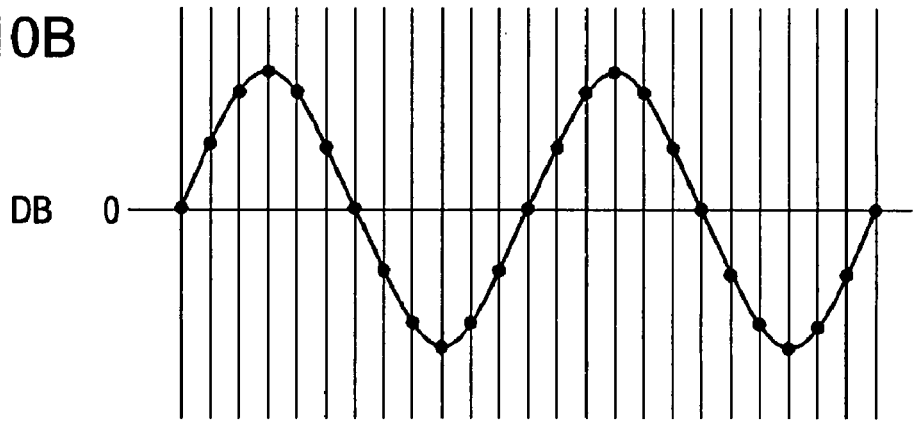

The digital data DA may be read from one at every two addresses at the clock frequency fc identical to the write clock, and the reading operation is repeated twice as shown in FIG. 10B. A sinusoidal signal SB of two cycles twice in frequency the sinusoidal signal SA is obtained for the duration TA. More specifically, during the duration TA, the harmonic overtone component SB twice in frequency the sinusoidal signal SA is obtained.

Figure 10C:
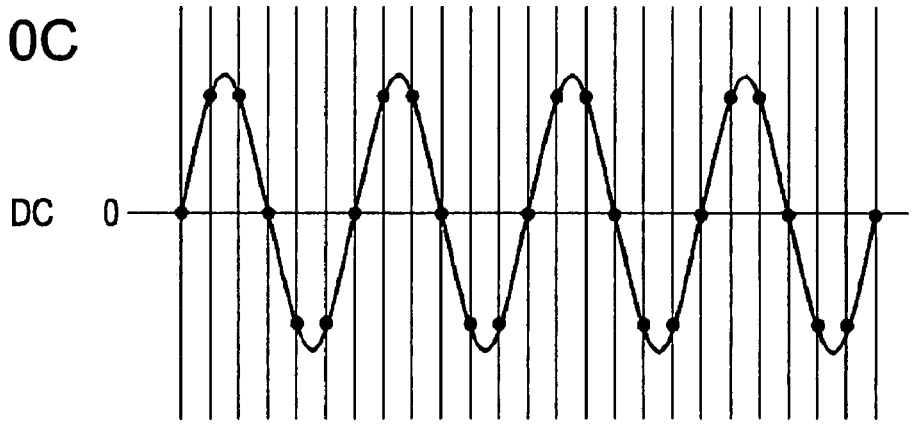
Figure 13:
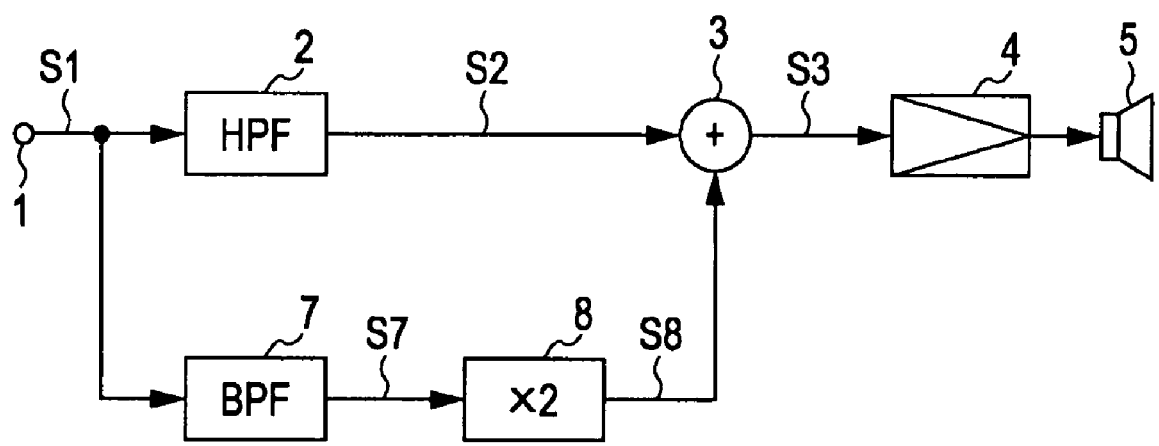
FIG. 13 illustrates the audio signal processing apparatus.
Figure 14A:
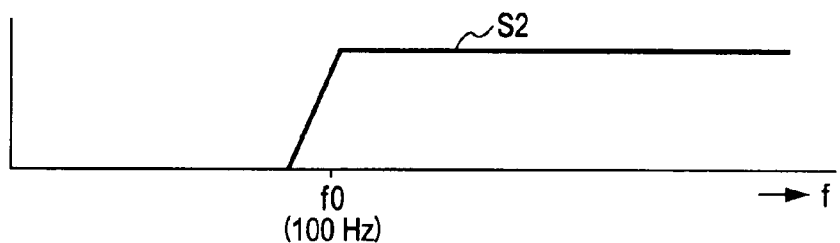
FIGS. 14A-14D illustrate frequency characteristics of the audio signal processing apparatus of FIG. 13.
Figure 14B:
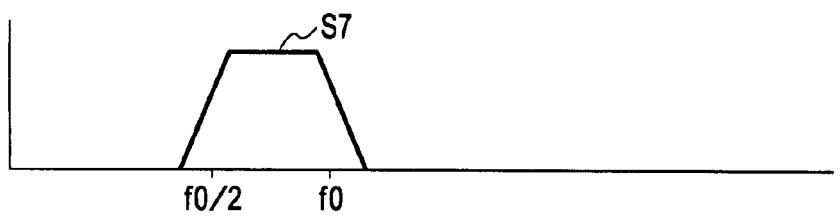
Figure 14C:
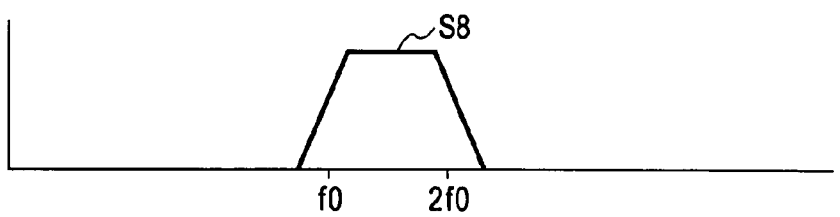
Figure 14D:
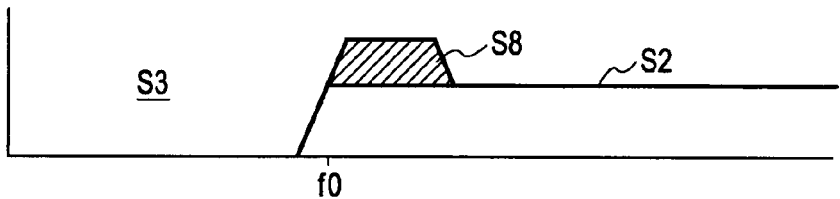

The digital data DA may be read from one at every four addresses at the clock frequency fc identical to the write clock, and the reading operation is repeated four times as shown in FIG. 10C. A sinusoidal signal SC of four cycles four times in frequency the sinusoidal signal SA is obtained for the duration TA. More specifically, during the duration TA, the harmonic overtone component SC four times in frequency the sinusoidal signal SA is obtained.

The pitch shifters 22 and 42 have a structure as shown in FIG. 11. FIG. 11 illustrates a memory 22M having large number of addresses (large capacity) composed of a ring buffer. The low frequency component S21 may have a waveform of FIG. 12A, digital data D21 may be obtained by analog-to-digital converting the waveform, and fc may represent a sampling frequency (clock frequency).

Let tx represent the timing at which the polarity of the digital data D21 (low-frequency component S21) is reversed from negative to positive, and Tx represent a duration from one tx to the next tx, namely, one period of the low-frequency component S21.

As shown in FIG. 11, the digital data D21 is supplied to the memory 22M via an input terminal 22A. As shown in FIG. 12A, the digital data D21 is written on the addresses of the memory 22M every one sample. The duration Tx of FIGS. 12A and 12 correspond to the duration TA of FIG. 10A. FIG. 12A corresponds to FIG. 10A.

At the same time as the digital data D21 is written on the memory 22M, the digital data D21 is read from the memory 22M. For simplicity of explanation, the duration Tx for the write operation equals the duration Tx for the read operation in FIGS. 12A and 12B.

The read operation from the memory 22M is performed in the same manner as described with reference to FIG. 10B. More specifically, the digital data D21 is read from one at every two addresses at the clock frequency fc equal to the one for the write operation. During the duration Tx, the read operation is repeated twice. Read digital data D22 is digital-to-analog converted, and the harmonic overtone component S22 twice in frequency the original low-frequency component S21 is obtained.

Similarly, the low-frequency component S41 is analog-to-digital converted and written on the memory 22M. The written data is then read as shown in FIG. 10C. The digital data D16 is read from one at every four addresses at the clock frequency fc equal to the one for the write operation. During the duration Tx, the read operation is repeated four times. Read digital data is digital-to-analog converted, and the harmonic overtone component S42 four times in frequency the original low-frequency component S41 is obtained.

Even when the low-frequency component S21 is lower in frequency than the resonance frequency f0 of the loudspeaker 5, the pitch shifter 22 converts the low-frequency component S21 into the harmonic overtone component S22 higher in frequency than the resonance frequency f0 of the loudspeaker 5. The harmonic overtone component S22 is added to the middle to high-frequency component S12 and the resulting component is supplied to the loudspeaker 5. Even the small loudspeaker 5 can provide the low frequency sound effect.

Since the harmonic overtone component S22 dynamically changes in level as shown in FIG. 3, a crisp low frequency sound effect is provided while distortion effect is restricted.

The low-frequency component S21 is frequency-doubled or frequency-quadrupled so that the resulting harmonic overtone components fall within the frequency range from the resonance frequency f0 of the loudspeaker 5 to the frequency upper limit f1. As a result, no unpleasant hearing impression is caused.

For example, since a harmonic overtone component with the frequency thereof three times the fundamental component has no octaval relationship with the fundamental component, an unpleasant hearing impression is given to the listener. The harmonic overtone components twice or four times in frequency the fundamental frequency have one octave or two octaves higher than the fundamental frequency and cause no unpleasant hearing impression to the listener.

In the above embodiments, the level detector 71 detects the peak level V22 within the one period Tx, and controls gain within the one period Tx. Alternatively, a mean level may be detected within the one period Tx, and gain is controlled within the one period Tx. Alternatively, the level of the harmonic overtone component supplied to the detector 71 is detected for each sample, in other words, the envelope of the harmonic overtone component is detected and used to control gain. Alternatively, gain may be controlled taking into consideration the characteristics of the loudspeaker 5 such as attack time and release time.

The control characteristics of the gain controller 23 of FIG. 4 may be inverted. More specifically, gain is set to be smaller than 1 with relationship V22>VTH held, and gain is set to be 1 with relationship V22=VTH held. Gain may be set to be larger than 1 with relationship V22<VTH held. In such a case, automatic gain control (AGC) also works and the low frequency sound effect is thus provided.

The process of obtaining intermediate signals and the resulting audio signal S3 from the audio signal S1 may be a digital process performed by a digital signal processor or other dedicated hardware. In such a case, the pitch shifter 22 and the gain controller 23 may share memory, for example.

In the above discussion, the pitch shifter 22 frequency multiplies the input digital data D21 (S21) every period of the digital data D21 as shown in FIGS. 10A-10C. Alternatively, the digital data D21 may be doubled in frequency every predetermined duration of time. In such a case, an end point of one period and a start point of the next period may be concatenated in a smooth fashion.

The resonance frequency f0 is the resonance frequency of the loudspeaker 5. In actual products, however, another frequency may be set as the frequency f0 taking into consideration a frequency at which the low frequency sound effect is desired. Compact disks (CDs) and super audio CDs (SACDs) can record substantially lower frequency components. To obtain a low-frequency sound effect from low-frequency components from these media, harmonic overtone components eight times, sixteen times, or thirty-two times the frequency of the low-frequency component may be added in addition to the frequency-doubled and the frequency-quadrupled harmonic overtone components. In other words, harmonic overtone components not above in frequency the frequency upper limit f1 and N times the low-frequency component intended to be low-frequency sound effect processed (N=$2^n$, n being an integer falling within a range of 1 through 6) are added.

It should be understood by those skilled in the art that various modifications, combinations, sub-combinations and alterations may occur depending on design requirements and other factors insofar as they are within the scope of the appended claims or the equivalents thereof.

What is claimed is:

1. An audio signal processing apparatus comprising:
   a high-pass filter for extracting from an audio signal a frequency component equal to or higher than a frequency f0;
   n band-pass filters for extracting, from the audio signal, frequency components falling within a frequency range from the frequency f0/N to a frequency f1/N;
   n harmonic overtone generators for frequency multiplying each of outputs of the n band-pass filters by N to generate harmonic overtone components having multiplied-by-N frequencies;
   a first combining unit for combining the harmonic overtone components generated by the n harmonic overtone generators;
   a level detector for detecting a level of a combined harmonic overtone component supplied from the first combining unit;
   a gain controller for controlling dynamically the combined harmonic overtone component supplied from the first combining unit based on a detection output from the level detector; and
   a second combining unit for combining the frequency component extracted by the high-pass filter and a controlled harmonic overtone component output from the gain controller, where N is 2n (n being a natural number), the frequency f0 is a first predetermined frequency, and the frequency f1 is a second predetermined frequency higher than the frequency f0.

2. The audio signal processing apparatus according to claim 1, wherein the frequency f0 is a resonance frequency of a loudspeaker, and
   wherein the frequency f1 is an upper frequency limit below which a signal obtained by frequency multiplying a fundamental frequency signal causes no unpleasant hearing impression.

3. The audio signal processing apparatus according to claim 1, wherein relationship f1≦f1/2 holds.

4. The audio signal processing apparatus according to claim 3, wherein relationship n=1 holds.

5. The audio signal processing apparatus according to claim 1, further comprising a first low-pass filter for limiting a second frequency component of an output of the first combining unit equal to or above the frequency f1.

6. The audio signal processing apparatus according to claim 1, wherein the frequency component is a first frequency component, further comprising a second low-pass filter for extracting from the audio signal a second frequency component equal to or lower than the frequency f1,
   wherein the second combining unit combines an output from the second low-pass filter at a predetermined ratio with the first frequency component and the controlled harmonic overtone component output from the gain controller.

7. The audio signal processing apparatus according to claim 1, wherein the level detector determines one cycle in response to a duration within which a polarity of the combined harmonic overtone component contained in an output of the first combining unit is reversed, and detects the level of the combined harmonic overtone component within the one cycle.

8. The audio signal processing apparatus according to claim 7, wherein the one cycle is a period from a reversal of the polarity of the level of the combined harmonic overtone component from negative to positive to a next reversal of the polarity of the level from negative to positive.

9. The audio signal processing apparatus according to claim 7, wherein the level detector detects a peak level in the one cycle.

10. The audio signal processing apparatus according to claim 7, wherein the level detector detects a mean level throughout the one cycle.

11. An audio signal processing method comprising steps of:
extracting from an audio signal a first frequency component equal to or higher than a frequency f0;
extracting, from the audio signal, second frequency components falling within a frequency range from the frequency f0/N to a frequency f1/N;
frequency multiplying each of the second frequency components output from n band-pass filters by N to generate harmonic overtone components having multiplied-by-N frequencies;
first combining the generated harmonic overtone components;
detecting a level of a combined harmonic overtone component supplied by the first combining step;
controlling dynamically the combined harmonic overtone component supplied by the first combining step based on a detection output in the detecting step; and
second combining the first frequency component and a controlled harmonic overtone component output in the controlling step,
where N is 2n (n being a natural number),
the frequency f0 is a first predetermined frequency, and
the frequency f1 is a second predetermined frequency higher than the frequency f0.

12. The audio signal processing method according to claim 11, wherein the frequency f0 is a resonance frequency of a loudspeaker, and
wherein the frequency f1 is an upper frequency limit below which a signal obtained by frequency multiplying a fundamental frequency signal causes no unpleasant hearing impression.

13. The audio signal processing method according to claim 11, wherein relationship $f0 \leq f1/2$ holds.

14. The audio signal processing method according to claim 13, wherein relationship n=1 holds.

15. The audio signal processing method according to claim 11, further comprising limiting a third frequency component output by the first combining step equal to or above the frequency f1.

16. The audio signal processing method according to claim 11, further comprising extracting from the audio signal a third frequency component equal to or lower than the frequency f1,
wherein the step of second combining includes combining the third frequency component at a predetermined ratio with the first frequency component and the controlled harmonic overtone component output in the controlling step.

17. The audio signal processing method according to claim 11, wherein the detecting step comprises determining one cycle in response to a duration within which a polarity of a low-frequency component contained in an output in the first combining step is reversed, and detecting the level of the combined harmonic overtone component within the one cycle.

18. The audio signal processing method according to claim 17, wherein the one cycle is a period from a reversal of the polarity of the level of the combined harmonic overtone component from negative to positive to a next reversal of the polarity of the level from negative to positive.

19. The audio signal processing method according to claim 17, wherein the step of detecting the level comprises detecting a peak level in the one cycle.

20. The audio signal processing method according to claim 17, wherein the step of detecting the level comprises detecting a mean level throughout the one cycle.

* * * * *